United States Patent
Chen et al.

(10) Patent No.: US 7,780,047 B2
(45) Date of Patent: Aug. 24, 2010

(54) CARRYING STRUCTURE FOR PORTABLE ELECTRONIC DEVICES

(75) Inventors: Rui-Hao Chen, Shenzhen (CN); Ye Liu, Shenzhen (CN); Shui-Yuan Qin, Shenzhen (CN); Chia-Hua Chen, Tucheng (TW); Hsiao-Hua Tu, Tucheng (TW)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 1158 days.

(21) Appl. No.: 11/308,113

(22) Filed: Mar. 7, 2006

(65) Prior Publication Data

US 2006/0213940 A1 Sep. 28, 2006

(30) Foreign Application Priority Data

Mar. 25, 2005 (CN) .................. 2005 1 0033856

(51) Int. Cl.
*A45F 5/00* (2006.01)
*G06F 1/16* (2006.01)
(52) U.S. Cl. ............... 224/218; 224/930; 224/255; 224/675; 455/575.6
(58) Field of Classification Search ........... 224/269, 224/930, 666, 255, 218, 667–669, 672, 675; 455/575.1, 575.6; 294/139
See application file for complete search history.

(56) References Cited

U.S. PATENT DOCUMENTS 3,833,781 A * 9/1974 Rumpf ................. 200/61.58 B
4,762,257 A * 8/1988 Spillers et al. .............. 224/663
5,155,659 A * 10/1992 Kunert ................. 361/679.56
5,737,412 A * 4/1998 Yamashita ................. 379/446
6,049,813 A * 4/2000 Danielson et al. ........... 708/100
6,318,610 B1 * 11/2001 Doherty ...................... 224/271
6,895,643 B2 * 5/2005 Itoigawa et al. .............. 24/633
6,944,015 B1 * 9/2005 Jenkins et al. ......... 361/679.03
7,023,692 B2 * 4/2006 Mansutti et al. ........ 361/679.56
7,116,220 B2 * 10/2006 Almaraz et al. .......... 340/457.1
D542,523 S * 5/2007 Labelson ..................... D3/208
7,469,809 B2 * 12/2008 Rodarte et al. .............. 224/578

FOREIGN PATENT DOCUMENTS

| GB | 2339359 A | * | 1/2000 |
| TW | 472991 | | 1/2002 |
| TW | 477501 | | 2/2002 |
| TW | 500295 | | 8/2002 |

* cited by examiner

*Primary Examiner*—Nathan J Newhouse
*Assistant Examiner*—John Cogill
(74) *Attorney, Agent, or Firm*—Jeffrey T. Knapp

(57) ABSTRACT

A portable electronic device includes a carrying structure and defines a mounting hole and an opposite strap hole. The carrying structure includes a snap module received in the mounting hole, having a pressing element, a snap element, a knuckle element and an elastic element, and a strap. The strap has two strap connecting ends connecting to the knuckle element and the strap hole. The pressing element has two extending portions, each of which has a wedge-shaped surface. The snap element has three wedge-shaped engaging portions. One engaging portion engages the knuckle element, latching the snap element with the knuckle element. The knuckle element and the snap element are unlockable by pressing the pressing element, where the one engaging portion disengages from the knuckle element, and anther two engaging portions slide aslant along the wedge-shaped surfaces. The elastic element has two ends resisting the snap element and the pressing element.

20 Claims, 7 Drawing Sheets

CARRYING STRUCTURE FOR PORTABLE ELECTRONIC DEVICES

FIELD OF THE INVENTION

The present invention relates to portable electronic devices and, particularly, to a carrying structure for portable electronic devices such as mobile phones and personal digital assistants (PDAs).

DESCRIPTION OF RELATED ART

With the development of wireless communication and information processing technologies, portable electronic devices such as mobile phones and PDAs are now in widespread use. As electronic devices enable consumers to enjoy the convenience of high-tech services anytime and anywhere, consumers like to carry their electronic devices with them. At present, there is no carrying structure which combines directly with these portable electronic devices, therefore, consumers need to carry their electronic devices in their pockets or in a portable case. An electronic device carried in a pocket of a user can easily fall out, especially, if the user stoops down or takes part in sports. In addition, it is uncomfortable for users to carry electronic devices in their pocket and the device may damage the lining of the pocket. If electronic devices are carried in a portable case, the portable case must be fixed with a strap in advance, thus it is inconvenient and the portable case may also suffer from wear and teal. Therefore, the above methods for carrying electronic devices are neither good nor convenient for long term use.

Therefore, a structure is needed which renders electronic devices easily portable whilst avoiding and overcoming the disadvantages of the structures set out above.

SUMMARY OF INVENTION

A carrying structure for a portable electronic device includes a snap module and a strap with two connecting ends. The portable electronic device has mounting hole in one end of the portable electronic device for receiving the snap module and has a strap hole defined in the other end of the portable electronic device. The snap module includes a pressing element, a snap element, a knuckle element and an elastic element. One strap connecting end is connected to the knuckle element and the other strap connecting end is fixed to the strap hole, the snap element is latched with the knuckle element, the elastic element has a first end resisting the snap element, and an opposite second end resisting the pressing element, the knuckle element and the snap element are unlockable by pressing the pressing element.

Other advantages and novel features of the carrying structure for portable electronic device will become more apparent from the following detailed description when taken in conjunction with the accompanying drawings.

BRIEF DESCRIPTION OF DRAWINGS

Many aspects of the carrying structure for portable electronic device can be better understood with reference to the following drawings. The components in the drawings are not necessarily to scale, the emphasis instead being placed upon clearly illustrating the principles of the carrying structure for portable electronic device. Moreover, in the drawings, like reference numerals designate corresponding parts throughout the several views.

DETAILED DESCRIPTION

Figure 1:
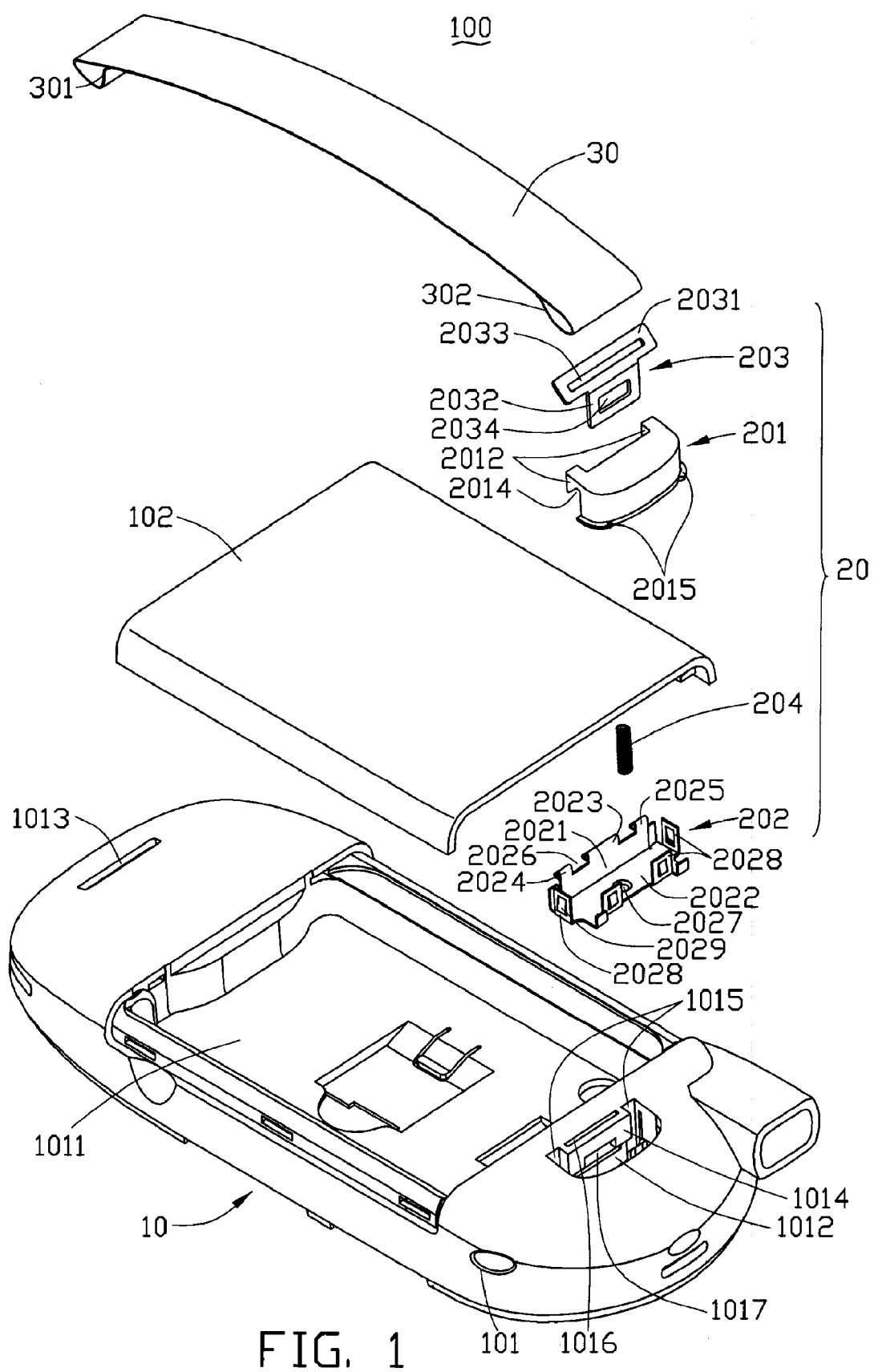
FIG. 1 is an exploded, isometric view of a carrying structure for portable electronic device, in accordance with a preferred embodiment.
Figure 2:
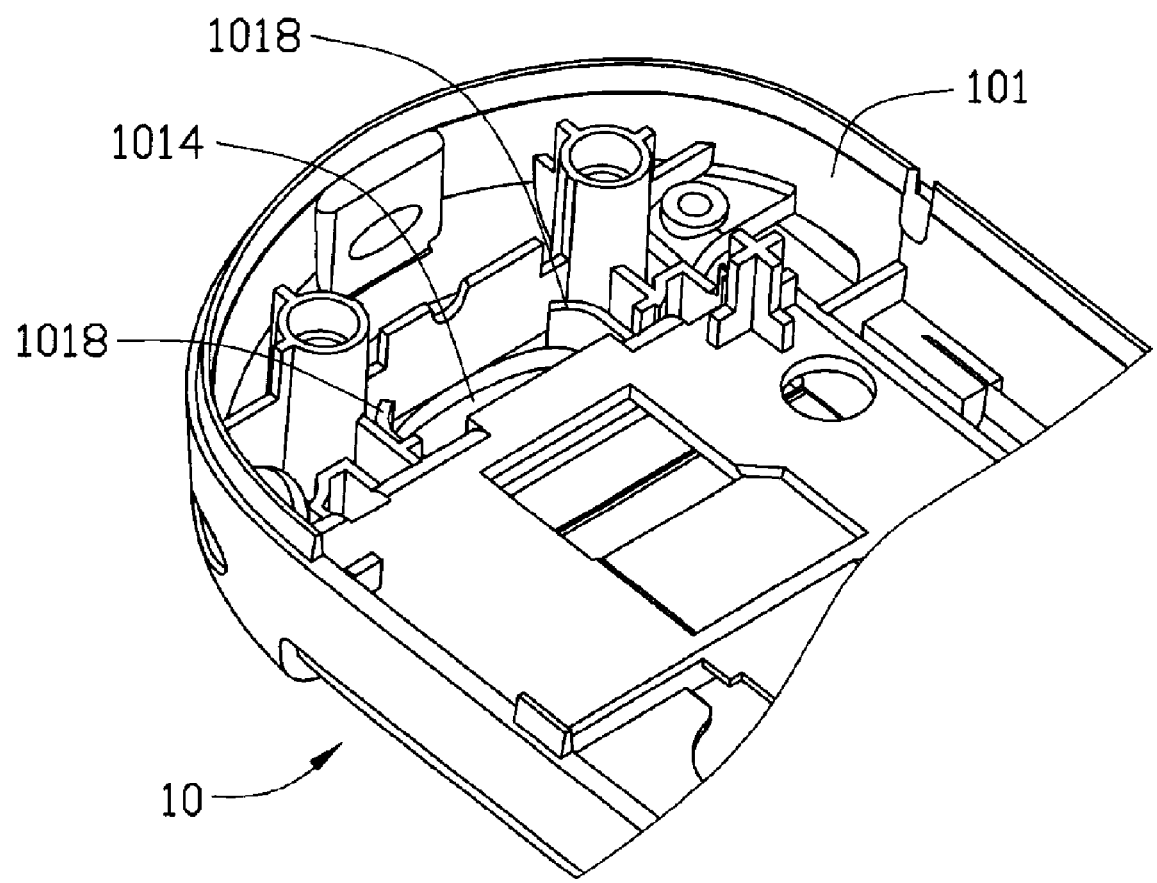
FIG. 2 is an isometric view of the body of the portable electronic device of FIG. 1, with a portion thereof cut away, and viewed from another aspect.

Referring now to FIG. 1 and FIG. 2, in a preferred embodiment, a carrying structure 100 for a portable electronic device 10 includes a snap module 20 and a strap 30 made of man-made/naturally fibre, plastic or leather. The strap 30 is strip-shaped and has two connecting ends 301, 302.

The portable electronic device 10 includes a body 101 and a battery cover 102. The body 101 defines a receiving cavity 1011 and has holding structures (not labbled) around receiving cavity 1011 for engaging with the battery cover 102. The body has a mounting hole 1012 defined in one end adjacent to the cavity 1011 and has a strap hole 1013 defined in the other end thereof. In the mounting hole 1012, a raised stage 1014 protrudes from the body 101. Two slots 1015 are defined between the raised stage 1014 and the body 101. The raised stage 1014 defines a first narrow slot 1016 and a second narrow slot 1017. The first narrow slot 1016 is positioned substantially perpendicular to the second narrow slot 1017. Two raised walls 1018 extend from the body 101 into the mounting hole 1012.

Figure 3:
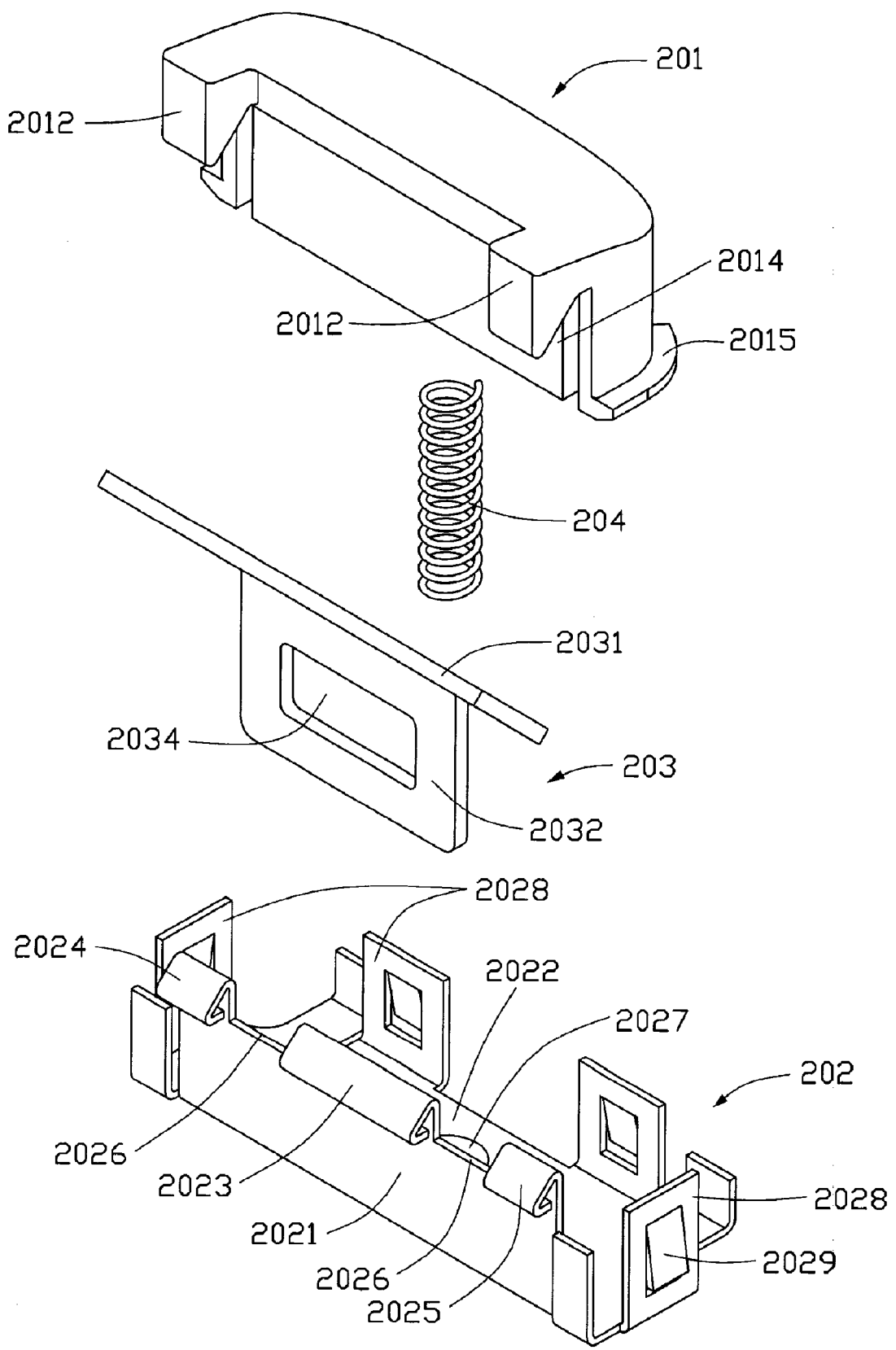
FIG. 3 is an exploded, isometric view of a snap module in accordance with the preferred embodiment shown in FIG. 1.

Referring also to FIG. 3, the snap module 20 includes a pressing element 201, a snap element 202, a knuckle element 203, and an elastic element 204. The knuckle element 203 can be locked with the snap element 202. The elastic element 204 is fixed in the pressing element 201 and resists the snap element 202. The knuckle element 203 can be unlocked from the snap element 202 by operating the pressing element 201.

Figure 4:
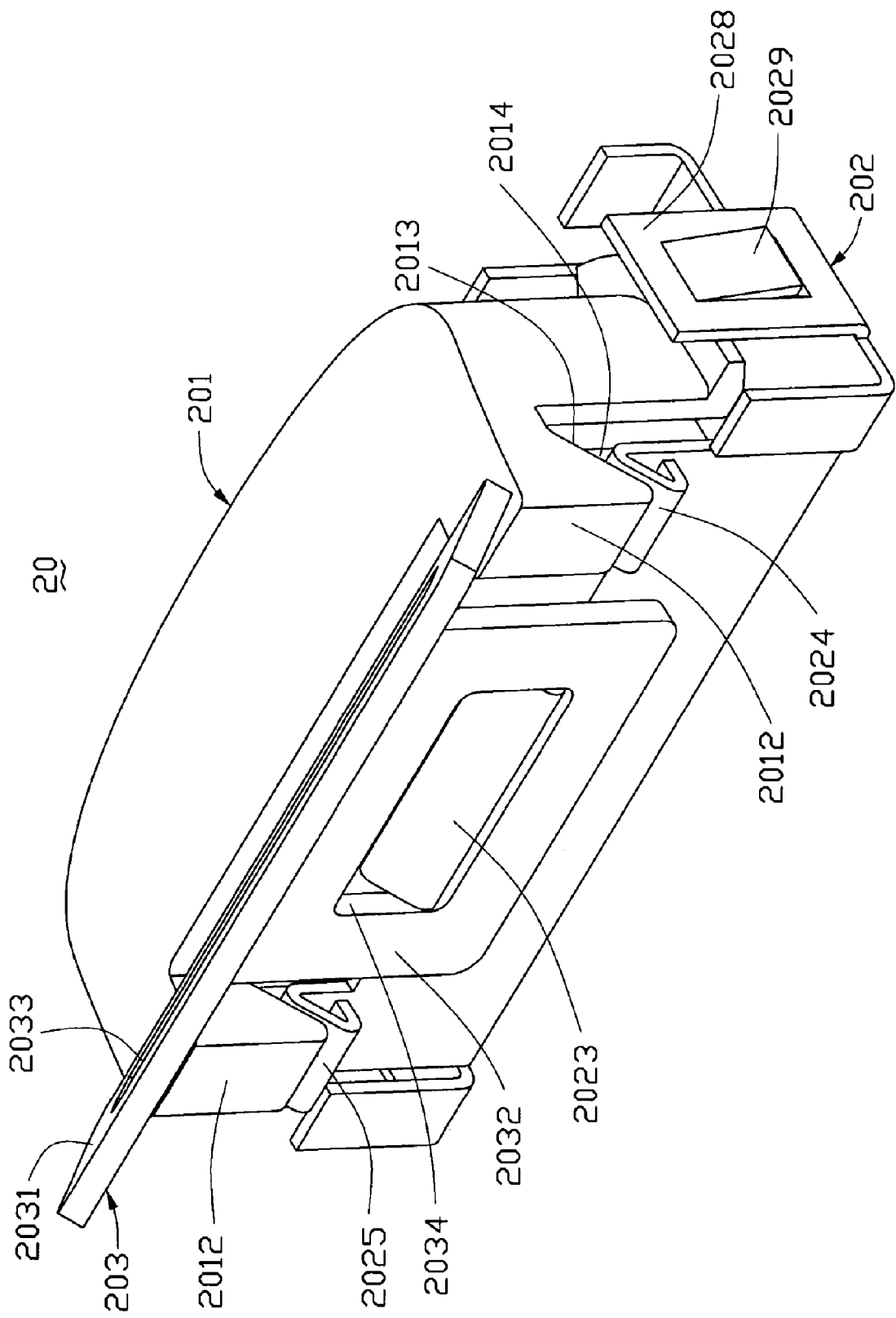
FIG. 4 is an assembled view of FIG. 3.
Figure 5:
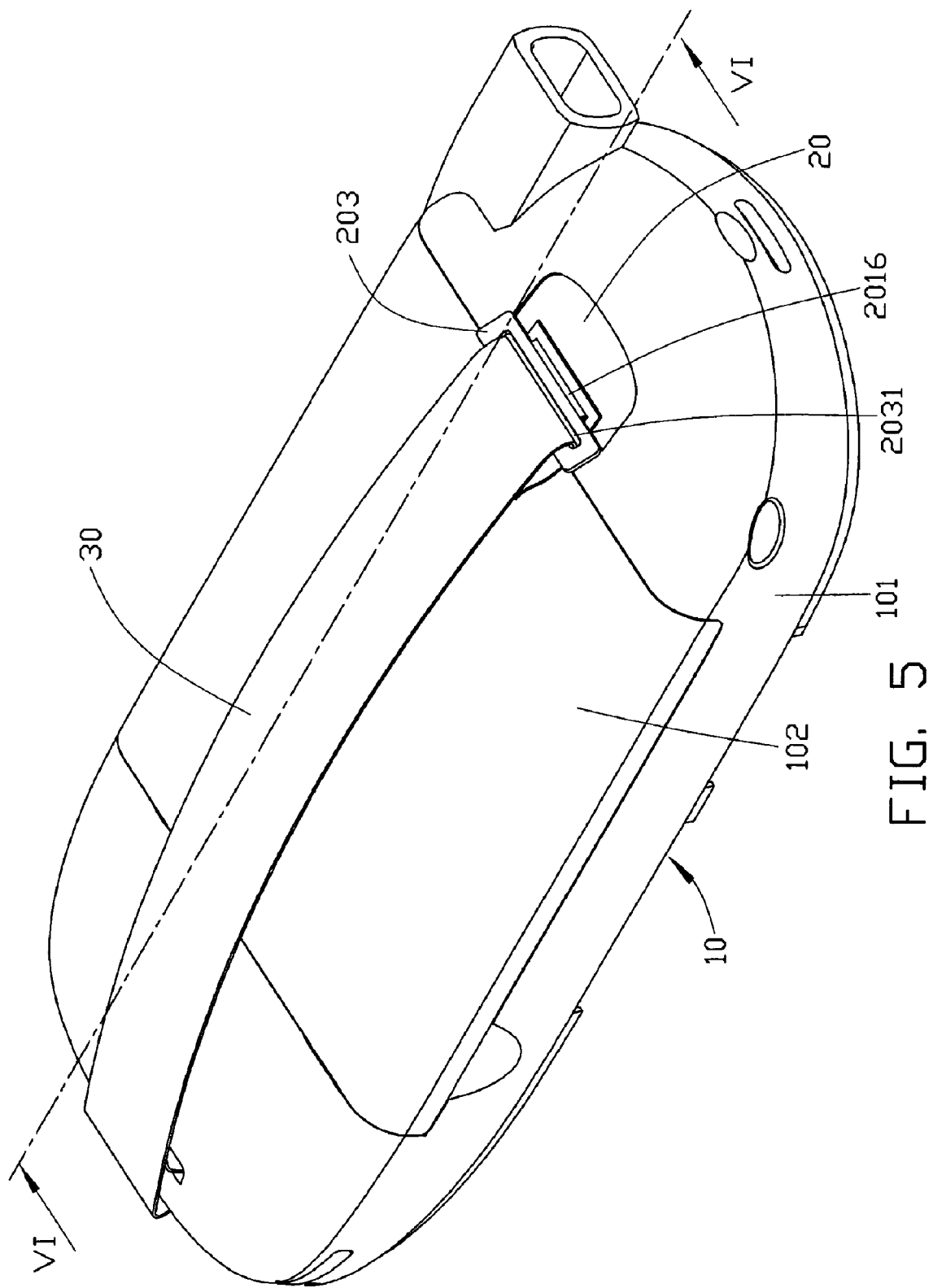
FIG. 5 is an assembled view of FIG. 1.
Figure 6:
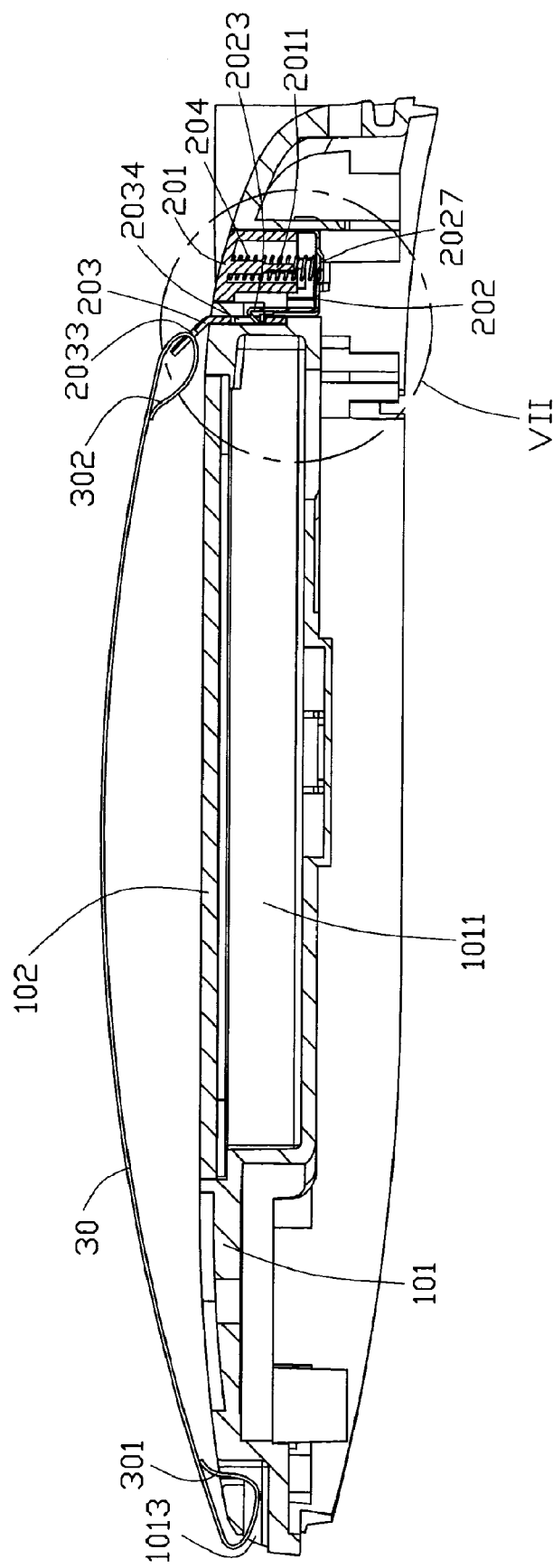
FIG. 6 is a cross-sectional view of FIG. 5, taken along line V-V thereof.
Figure 7:
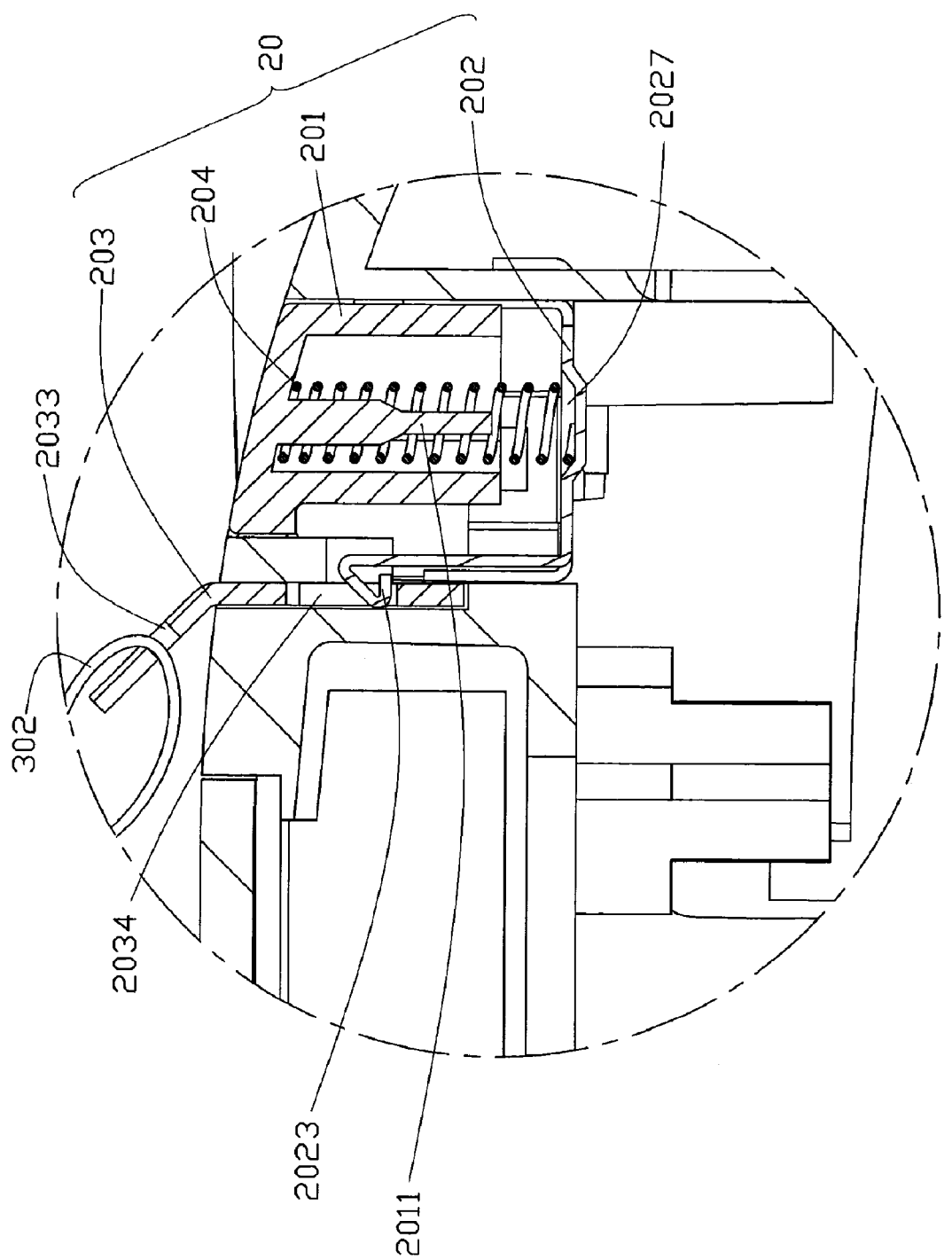
FIG. 7 is an enlarged view of an encircled portion VI shown in FIG. 6.

Referring to FIG. 4, the shape of the pressing element 201 is almost the same as that of the mounting hole 1012, but the size of the pressing element 201 is slightly greater than that of the mounting hole 1012. The pressing element 201 defines a cavity (not labbled), and a pole 2011 extending from the pressing element 201 is set in the cavity. Two extending portions 2012 extend from one side of the pressing element 201. Each of the extending portions 2012 has a wedge-shaped surface 2013. For these, two wedge-shaped receiving spaces 2014 are defined in the pressing element 201 adjacent to the wedge-shaped surfaces 2013. Two protruding pieces 2015 extend horizontally from one end of the pressing element 201 and the two protruding pieces 2015 are arc-shaped.

The snap element 202 includes a first plate 2021 and a second plate 2022. The first plate 2021 is perpendicular to the second plate 2022. A first wedge-shaped engaging portion 2023 is formed at one end of the first plate 2021. The first plate 2021 has a second wedge-shaped engaging portion 2024 and a third wedge-shaped engaging portion 2025 at each side of the first wedge-shaped engaging portion 2023. Two separate gaps 2026 are defined in between the first wedge-shaped engaging portion 2023, the second wedge-shaped engaging portion 2024 and the third wedge-shaped engaging portion 2025. A round hole 2027 is defined in the center of the second plate 2022, for insertion of the pole of the 2011 of the pressing element. Four protruding elements 2028 extend from the edge of the second plate 2022. Each protruding element 2028 has an elastic piece 2029.

The knuckle element 203 has a flat first board 2031 and a flat second board 2032. The first board 2031 and a second board 2032 are substantially rectangular in shape. The width of the first board 2031 is larger than that of the second board 2032. The first board 2031 is inclined and connected to one end of the second board 2032. A strip hole 2033 is defined in the first board 2031. The size of the second board 2032 is smaller than that of the first narrow slot 1016 of the body 101. A holding hole 2034 is defined in the second board 2032 and the holding hole 2034 is larger than the first wedge-shaped engaging portion 2023 of the first plate 2021 of the pressing element 201.

The elastic element 204 is a compressed spring for engaging with the a pole 2011 of the pressing element 201. The elastic element 204 can also be other kinds of springs for example, plastic spring, rubber spring, or helical spring.

In assembly, referring together to FIGS. 2-7, first, the elastic element 204 is engaged with the pole 2011 of the pressing element 201, then, the pressing element 201 is mounted on the snap element 202. Thus, the elastic element 204 is fixed in the pressing element 201 and resists the wall of the round hole 2027 of the snap element 202. The second wedge-shaped engaging portion 2024 and the third wedge-shaped engaging portion 2025 are first received in the wedge-shaped receiving space 2014, and then, in the pressing element 201. The snap element 202, and the elastic element 204 are received in the mounting hole 1012 of the body 101. Each elastic piece 2029 of the protruding elements 2028 tightly engages with the wall of the mounting hole 1012 and the two extending portions 2012 of the pressing element 201 engage with the two slots 1015 of the body 101. The protruding pieces 2015 of the pressing element 201 resist the raised walls 1018 in the mounting hole 1012. The first wedge-shaped engaging portion 2023 of the snap element 202 is received in the second narrow slot 1017 of the portable electronic device 10. The second board 2032 is then inserted through the first narrow slot 1016 of the raised stage 1014 of the portable electronic device 10 and the holding hole 2034 of the second board 2032 is latched with the first wedge-shaped engaging portion 2023 of the snap element 202. Finally, the connecting end 301 of the strap 30 is fixed in the strap hole 1013 of the body 101 and the other connecting end 302 is fixed in the strip hole 2033 of the first board 2031, then the carrying structure 100 for portable electronic device 10 is assembled to a whole.

In use, when the pressing element 201 is pressed, the elastic element 204 can be compressed so that the first wedge-shaped engaging portion 2023 of the snap element 202 is disengaged from the holding hole 2034 of the second board 2032.

The carrying structure 100 includes the snap module 20 and the strap 30 with two connecting ends 301, 302 combining with a portable electronic device. Thus, a portable electronic device with such carrying structure 100 is convenient for carrying and long use.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A portable electronic device having a mounting hole defined in one end portion thereof, and a strap hole defined in the other end portion thereof, the portable electronic device comprising a carrying structure, the carrying structure comprising:
    a snap module received in the mounting hole, the snap module comprising a pressing element, a snap element, a knuckle element and an elastic element; and
    a strap with two strap connecting ends;
    wherein one strap connecting end is connected to the knuckle element and the other strap connecting end is fixed to the strap hole, the pressing element having two extending portions extending therefrom, each of the extending portions having a wedge-shaped surface, the snap element having a first wedge-shaped engaging portion, a second wedge-shaped engaging portion and a third wedge-shaped engaging portion, each of the first wedge-shaped engaging portion, second wedge-shaped engaging portion, and third wedge-shaped engaging portion being spaced apart from each other, the second wedge-shaped engaging portion and the third wedge-shaped engaging portions located at two opposite sides of the first wedge-shaped engaging portion, the snap element is latched with the knuckle element by an engaging of the first wedge-shaped engaging portion with the knuckle element, the elastic element has a first end resisting the snap element, and an opposite second end resisting the pressing element, the knuckle element and the snap element are unlockable by pressing the pressing element, where the first wedge-shaped engaging portion disengages from the knuckle element, and the second wedge-shaped engaging portion and the third wedge-shaped engaging portion slide aslant along the wedge-shaped surfaces.

2. The portable electronic device as claimed in claim 1, wherein the strap is made of one of fiber, plastic and leather.

3. The portable electronic device as claimed in claim 1, further comprising a body and a battery cover, the body defines a receiving cavity and has holding structures around receiving cavity for engaging with the battery cover, the mounting hole is defined in one end of the body and the strap hole is defined in the other end of the body.

4. The portable electronic device as claimed in claim 3, wherein a raised stage protrudes from the body in the mounting hole, the knuckle element has a flat first board and a flat second board connected to the first board, and the raised stage defines a first narrow slot for receiving the second board.

5. The portable electronic device as claimed in claim 4, wherein the first board and the second board are both rectangular in shape, and the width of the first board is greater than that of the second board.

6. The portable electronic device as claimed in claim 4, wherein the raised stage defines a second narrow slot perpendicular to the first narrow slot, the snap element has a first plate and a second plate perpendicular to the first plate, and the first wedge-shaped engaging portion is formed at the end of the first plate for engaging in the second narrow slot.

7. The portable electronic device as claimed in claim 6, wherein the first board is inclined with respect to, and connected to one end of, the second board, and the first board defines a strip hole for connecting with one of the strap connecting ends and the second board defines a holding hole, and the holding hole is larger than the first wedge-shaped engaging portion of the first plate.

8. The portable electronic device as claimed in claim 7, wherein the pressing element defines two wedge-shaped receiving spaces for receiving the second wedge-shaped engaging portion and the third wedge-shaped engaging portion.

9. The portable electronic device as claimed in claim 8, wherein two separate gaps are defined in between the first wedge-shaped engaging portion, the second wedge-shaped engaging portion and the third wedge-shaped engaging portion.

10. The portable electronic device as claimed in claim 7, wherein a round hole is defined in the center of the second plate for receiving one end of the elastic element, and four protruding elements extend from the edge of the second plate and each protruding element has an elastic piece for engaging with the mounting hole.

11. The portable electronic device as claimed in claim 10, wherein the pressing element has a shape substantially the same as that of the mounting hole, and the size of the pressing element is slightly greater than that of the mounting hole.

12. The portable electronic device as claimed in claim 10, wherein the pressing element comprises a pole extending therefrom, the elastic element is one of compression spring, plastic spring, rubber spring, and helical spring arranged around the pole.

13. The portable electronic device as claimed in claim 10, wherein two slots are defined between the raised stage and the body corresponding to the two extending portions.

14. The portable electronic device as claimed in claim 10, wherein two protruding pieces extend horizontally from one end of the pressing element, two raised walls extend from the body into the mounting hole corresponding to two protruding pieces, and the two protruding pieces are arc-shaped.

15. A portable electronic device, comprising:
a first portion defining a mounting hole;
a second portion defining a strap hole;
a carrying structure comprising:
    a strap including opposite first and second strap ends, the first strap end being configured for being connected with a first portion of a portable electronic device; and
    a snap module configured for being arranged at a second portion of the portable electronic device, the snap module comprising:
    a snap element configured for being fixed with the portable electronic device, the snap element including a first wedge-shaped engaging portion;
    a knuckle element including a first connecting portion connected to the second strap end, and a second connecting portion configured for engaging with the first engaging portion of the snap element to thereby lock the second strap end with the snap module; and
    a pressing element including a pressing portion thereon, the pressing element having two extending portions extending therefrom, each of the extending portions having a wedge-shaped surface, the snap element having the first wedge-shaped engaging portion, a second wedge-shaped engaging portion and a third wedge-shaped engaging portion, each of the first wedge-shaped engaging portion, second wedge-shaped engaging portion, and third wedge-shaped engaging portion being spaced apart from each other, the second wedge-shaped engaging portion and a third wedge-shaped engaging portions located at two opposite sides of the first wedge-shaped engaging portion, the pressing portion being configured for engaging one of the snap element and the knuckle element to unlock the knuckle element when the pressing element is pressed, where the first wedge-shaped engaging portion disengages from the knuckle element, and the second wedge-shaped engaging portion and a third wedge-shaped engaging portion slide aslant along the wedge-shaped surfaces.

16. The portable electronic device of as claimed in claim 15, wherein the snap module comprises an elastic element biasing the pressing element against the snap element.

17. The portable electronic device as claimed in claim 16, wherein a raised stage protrudes from the portable electronic device in the mounting hole, the first connecting portion comprises a flat first board and the second connecting portion comprises a flat second board connected to the first board, and the raised stage defines a first narrow slot receiving the second board therein.

18. The portable electronic device of as claimed in claim 15, wherein the portable electronic device defines a strap hole in the first portion thereof, and a mounting hole in the second portion thereof, and the snap module is received in the mounting hole.

19. The portable electronic device as claimed in claim 18, wherein the raised stage defines a second narrow slot perpendicular to the first narrow slot, the snap element has a first plate and a second plate perpendicular to the first plate, and the first wedge-shaped engaging portion is formed at the end of the first plate and received in the second narrow slot.

20. The portable electronic device as claimed in claim 19, wherein the first plate has the second wedge-shaped engaging portion formed adjacent to the first wedge-shaped engaging portion, and the pressing element forms an extending portion for pressing the second wedge-shaped engaging portion to unlock the knuckle element.

* * * * *